United States Patent
Wu et al.

(10) Patent No.: US 9,758,689 B2
(45) Date of Patent: Sep. 12, 2017

(54) SILVER NANOPARTICLE INKS COMPRISING AMINOMETHYLSILANES

(71) Applicant: XEROX CORPORATION, Norwalk, CT (US)

(72) Inventors: Yiliang Wu, Oakville (CA); Guiqin Song, Milton (CA); Biby Esther Abraham, Mississauga (CA); Yvan Gagnon, Mississauga (CA); Ping Liu, Mississauga (CA)

(73) Assignee: XEROX CORPORATION, Norwalk, CT (US)

( * ) Notice: Subject to any disclaimer, the term of this patent is extended or adjusted under 35 U.S.C. 154(b) by 107 days.

(21) Appl. No.: 14/517,692

(22) Filed: Oct. 17, 2014

(65) Prior Publication Data
US 2016/0108271 A1  Apr. 21, 2016

(51) Int. Cl.

| | |
|---|---|
| *C09D 11/52* | (2014.01) |
| *C09D 11/38* | (2014.01) |
| *C08K 5/544* | (2006.01) |
| *C08K 3/08* | (2006.01) |
| *C09D 11/30* | (2014.01) |
| *H05K 1/09* | (2006.01) |
| *B05D 5/12* | (2006.01) |
| *C09D 5/10* | (2006.01) |
| *C09D 11/03* | (2014.01) |
| *C09D 11/037* | (2014.01) |
| *C09D 11/322* | (2014.01) |
| *C09D 11/36* | (2014.01) |

(52) U.S. Cl.
CPC ............... *C09D 11/52* (2013.01); *B05D 5/12* (2013.01); *C08K 5/544* (2013.01); *C09D 5/10* (2013.01); *C09D 11/03* (2013.01); *C09D 11/037* (2013.01); *C09D 11/30* (2013.01); *C09D 11/322* (2013.01); *C09D 11/36* (2013.01); *C09D 11/38* (2013.01); *H05K 1/097* (2013.01); *C08K 3/08* (2013.01); *C08K 2003/0806* (2013.01); *C08K 2201/011* (2013.01)

(58) Field of Classification Search
None
See application file for complete search history.

(56) References Cited

U.S. PATENT DOCUMENTS

| | | | |
|---|---|---|---|
| 2008/0071043 A1* | 3/2008 | Ram | C08L 83/08 525/477 |
| 2010/0233361 A1* | 9/2010 | Hu | B22F 1/0022 427/125 |

OTHER PUBLICATIONS

Lopez-Tobar, Eduardo, Stability of the Disulfide Bond in Cystine Adsorbed on Silver and Gold Nanoparticles as Evidenced by SERS Data, J. Phys. Chem. C2013, 117, 1531-1537.
Sironmani, A. et al. (2011) Silver Nanoparticles-Universal Multifunctional Nanoparticles for Bio Sensing, Imaging for Diagnostic and Targeted Drug Delivery for Therapeutic Applications, Drug Delivery and Development—Present and Future, Dr. Izet Kapetanovic (Ed.), ISBN: 978-953-307-615-7, In Tech, http://www.intechopen.com/books/drug-discovery-and-development-present-and-future/silver-nanoparticles-universal-multifunctional-nanoparticles-for-bio-sensing-imaging-for-diagnostics.
Kneipp, K. et al. Surface-enhanced Raman scattering and biophysics, J. Phys.: Condens. Matter 14 (2002) R597-R624.
Lee, K et al., In Vivo Imaging of Transport and Biocompatibility of Single Silver Nanoparticles in Early Development of Zebrafish Embryos (Sep. 2007) ACS Nano, vol. 1, No. 2, 133-143.
Korbekandi, H. et al., (2012) Silver Nanoparticles, The Delivery of Nanoparticles, Dr. Abbass A. Hashim (Ed.), ISBN: 978-953-51-0615-9, InTech, http://www.intechopen.com/books/the-delivery-of-nanoparticles/silver-nanoparticles.
Rashid, M. et al. Synthesis of Silver Nano Particles (Ag—NpS) and their uses for Quantitative Analysis of Vitamin C Tablets, Dhaka Univ. J. Pharm. Sci. 12(1): 29-33, Jun. 2013.
Rivera, P. et al., Synthesis and characterization of silver nanoparticles for biosensor design, Universidad Interamericana de Puerto Rico—Recinto de Ponce, Revista 360°/No. 8/2013.

* cited by examiner

*Primary Examiner* — Katie L Hammer
(74) *Attorney, Agent, or Firm* — Pillsbury Winthrop Shaw Pittman LLP

(57) ABSTRACT

An ink includes a plurality of silver nanoparticles, an aminomethylsilane viscosifier, and a hydrocarbon solvent. A method includes providing an ink including a plurality of silver nanoparticles, an aminomethylsilane viscosifier, and a hydrocarbon solvent, the method including printing an image on a substrate with the ink, and annealing the image on the substrate. An ink includes organoamine-stabilized silver nanoparticles, a viscosifier comprising N-(6-aminohexyl)aminomethyltriethoxysilane, and a hydrocarbon solvent.

18 Claims, 1 Drawing Sheet

SILVER NANOPARTICLE INKS COMPRISING AMINOMETHYLSILANES

BACKGROUND

The present disclosure relates to inks. In particular, the present disclosure relates to inks comprising silver nanoparticles.

One of the continuing challenges for ink formulations is to obtain proper rheology properties, as different printing technologies require inks having different viscosity ranges. For example, inkjet technology usually requires a Newtonian fluid with viscosity typically from about 5 to 15 cps, while flexographic and gravure printing often need a non-Newtonian fluid with viscosity around 20-200 cps for flexographic printing and 100-1000 cps for gravure printing. Various rheology modifiers have been developed to address different ink formulations according to the viscosity requirements for each particular printing application. However, a universal rheology modifier that can adjust the viscosity of silver nanoparticle inks across the range of printing technologies remains to be developed.

SUMMARY

In some aspects, embodiments herein provide inks comprising a plurality of silver nanoparticles, an aminomethylsilane viscosifier, and a hydrocarbon solvent.

In some aspects, embodiments herein provide methods comprising providing an ink comprising a plurality of silver nanoparticles, an aminomethylsilane viscosifier, and a hydrocarbon solvent, printing an image on a substrate with the ink, and annealing the image on the substrate.

In some aspects, embodiments herein provide inks comprising organoamine-stabilized silver nanoparticles, a viscosifier comprising N-(6-aminohexyl)aminomethyltriethoxysilane, and a hydrocarbon solvent.

BRIEF DESCRIPTION OF DRAWINGS

Various embodiments of the present disclosure will be described herein below with reference to the figures wherein.

DETAILED DESCRIPTION

Figure 1:
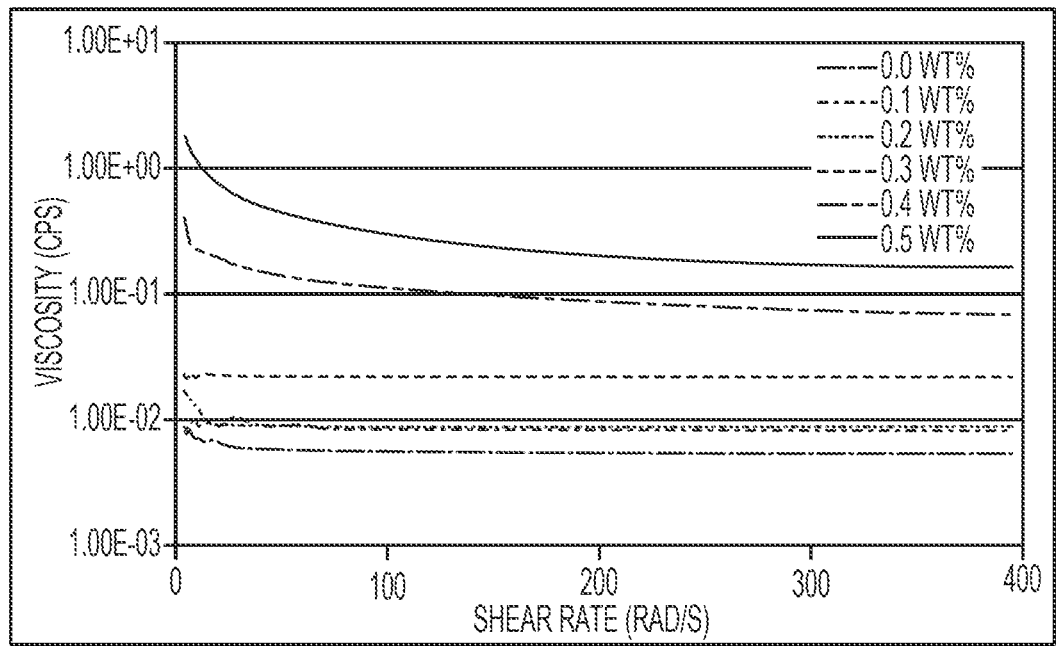
FIG. 1 shows a plot of viscosity of silver nanoparticle ink as a function of shear rate for inks with different aminosilane additives.
Figure 2:
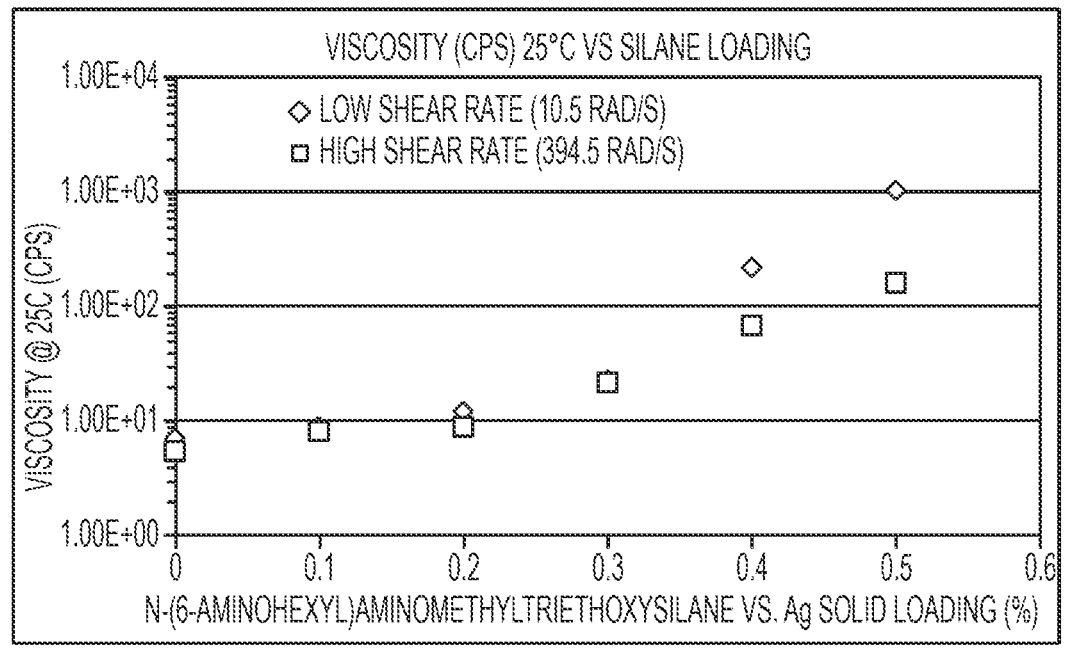
FIG. 2 shows a plot of viscosity of the silver nanoparticle ink at low and high shear rates as a function of aminosilane loading.

Embodiments herein provide inks comprising silver nanoparticles with universal rheology modifying viscosifiers to address different printing technologies including inkjet printing, aerosol jet printing, flexographic printing, gravure printing, and screen printing. One of the major challenges for ink formulation is to obtain the proper rheology, as different printing technologies require inks having different viscosity ranges. Embodiments herein provide universal additives (or viscosity modifier) that can adjust the viscosity of silver nanoparticle inks for all aforementioned printing technologies, simply by changing the amount of the viscosity modifier. Thus, there are provided silver nanoparticle inks with tunable viscosity from about a few centipoises to about a few thousands centipoise (at 25° C.) using a universal aminomethylsilane viscosifier. The inks generally comprise a plurality of silver nanoparticles an aminomethylsilane viscosifier, and a hydrocarbon solvent.

The silver nanoparticles may have a particle size of for example less than about 100 nm, less than about 50 nm, less than about 25 nm, or less than about 10 nm. The particle size is provided herein as an average effective diameter of silver nanoparticles, excluding any stabilizer, and as determined by transmission electron microscopy ("TEM"). Generally, a plurality of particle sizes may exist in the silver nanoparticles obtained from the preparation. In embodiments, the existence of different sized silver-containing nanoparticles is acceptable. For example silver nanoparticles may have a bi-model distribution, relatively smaller particles having a size from about 3 nm to about 20 nm, and relatively larger particles have a size from about 50 nm to about 100 nm.

In some embodiments, the silver nanoparticles are stabilized. As used herein, "stabilized" means the nanoparticles will generally not aggregate with one another. Any suitable stabilizer may be used which has the function of minimizing or preventing the silver-containing nanoparticles from aggregation in a liquid and optionally providing the solubility or dispersibility of silver-containing nanoparticles in a liquid. In addition, the stabilizer is thermally removable which means that the stabilizer can be caused to dissociate from the silver-containing nanoparticle surface under certain conditions such as through heating. The heating may be accomplished to a certain temperature such as for example below about 250° C., or below about 200° C., under normal atmospheric conditions or at a reduced pressure of for example from several mbars to about $10^{-3}$ mbar. The thermal dissociation of the stabilizer from the silver-containing nanoparticles at a temperature such as for example lower than about 250° C. may result in the evaporation of the stabilizer or decomposition of the stabilizer into gaseous forms.

In embodiments, the stabilizer may be an organic stabilizer. The term "organic" in "organic stabilizer" refers to the presence of carbon atom(s), but the organic stabilizer may include one or more non-metal heteroatoms such as nitrogen, oxygen, sulfur, silicon, halogen, and the like. Exemplary organic stabilizers include for instance thiol and its derivatives, amine and its derivatives, carboxylic acid and its carboxylate derivatives, polyethylene glycols, and other organic surfactants. In embodiments, the organic stabilizer is selected from the group consisting of a thiol such as for example butanethiol, pentanethiol, hexanethiol, heptanethiol, octanethiol, decanethiol, and dodecanethiol; an amine such as for example ethylamine, propylamine, butylamine, penylamine, hexylamine, heptylamine, octylamine, nonylamine, decylamine, and dodecylamine, hexydecylamine, oleyl amine, and the like; a dithiol such as for example 1,2-ethanedithiol, 1,3-propanedithiol, and 1,4-butanedithiol; a diamine such as for example ethylenediamine, 1,3-diaminopropane, 1,4-diaminobutane; a mixture of a thiol and a dithiol; and a mixture of an amine and a diamine. Organic stabilizers containing a pyridine derivative (e.g., dodecyl pyridine) and/or organophosphine that can stabilize silver-containing nanoparticles are also included as a stabilizer in the present embodiments.

In embodiments, the stabilizer is an organoamine such as for example butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine, and the like, or mixtures thereof.

One, two, three or more stabilizers may be used. In embodiments where two or more stabilizers are used, each stabilizer may be present at any suitable weight ratio or molar ratio such as for example from about 99 (first stabilizer): 1 (second stabilizer) to about 1 (first stabilizer):99 (second stabilizer). The amount of the stabilizer used is for example about 1 or more molar equivalents per mole of silver compound, or about 2 or more molar equivalents per mole of silver compound, or about 10 or more molar equivalents per mole of silver compound, or about 25 or more molar equivalents per mole of silver compound.

In embodiments, the silver-containing nanoparticles may form a chemical bond with the stabilizer. The chemical names of the stabilizer provided herein are before formation of any chemical bond with the silver-containing nanoparticles. It is noted that the nature of the stabilizer may change with the formation of a chemical bond, but for convenience the chemical name prior to formation of the chemical bond is used.

The attractive force between the silver-containing nanoparticles and the stabilizer can be a chemical bond and/or physical attachment. The chemical bond can take the form of for example covalent bonding, hydrogen bonding, coordination complex bonding, or ionic bonding, or a mixture of different chemical bondings. The physical attachment can take the form of for example van der Waals' forces or dipole-dipole interaction, or a mixture of different physical attachments.

The extent of the coverage of stabilizer on the surface of the silver-containing nanoparticles can vary for example from partial to full coverage depending for instance on the capability of the stabilizer to stabilize the silver-containing nanoparticles in the solvent. The percentages of coverage can be from about 85% to 100%, including from 90% to 100%, or from about 95% to about 99%. Of course, there is variability as well in the extent of coverage of the stabilizer among the individual silver-containing nanoparticles.

In embodiments, the silver nanoparticles may comprise solely elemental silver or may be a silver composite, including composites with other metals. Such metal-silver composite may include either or both of (i) one or more other metals and (ii) one or more non-metals. Suitable other metals include for example Al, Au, Pt, Pd, Cu, Co, Cr, In, and Ni, particularly the transition metals for example Au, Pt, Pd, Cu, Cr, Ni, and mixtures thereof. Exemplary metal composites are Au—Ag, Ag—Cu, Au—Ag—Cu, and Au—Ag—Pd. Suitable non-metals in the metal composite include for example Si, C, and Ge. The various components of the silver composite may be present in an amount ranging for example from about 0.01% to about 99.9% by weight, particularly from about 10% to about 90% by weight. In embodiments, the silver composite is a metal alloy composed of silver and one, two or more other metals, with silver comprising for example at least about 20% of the nanoparticles by weight, particularly greater than about 50% of the nanoparticles by weight. Unless otherwise noted, the weight percentages recited herein for the components of the silver-containing nanoparticles do not include the stabilizer.

Silver nanoparticles composed of a silver composite can be made for example by using a mixture of (i) a silver compound (or compounds, especially silver (I) ion-containing compounds) and (ii) optionally another metal salt (or salts) or another non-metal (or non-metals) in a reduction reaction with the presence of the stabilizers.

The preparation of silver nanoparticle inks, which may suitable for the preparation of conductive elements for electronic applications can be carried out using all or some of the following procedures: (i) addition of a scavenger to the final reduction reaction mixture from the preparation of silver-containing nanoparticles to destroy excess reducing agent; (ii) concentrating the reaction mixture by removing solvent; (iii) adding the concentrated reaction mixture to a non-solvent (or vice versa) to precipitate the silver-containing nanoparticles; (iv) collecting the silver-containing nanoparticles by filtration or centrifugation to result in isolated silver-containing nanoparticles (with the stabilizer molecules on the surface of the silver-containing nanoparticles); (v) dissolving or dispersing (assisted by for example ultrasonic and/or mechanical stirring) the isolated silver-containing nanoparticles (with molecules of the stabilizer on the surface of the silver-containing nanoparticles) in an appropriate liquid.

Silver-containing nanoparticle compositions can also be made by mixing silver-containing nanoparticles with other metal or non-metal nanoparticles.

In embodiments, it may be possible to form a silver nanoparticle inks (with stabilizer molecules on the surface of the silver nanoparticles) suitable for forming conductive elements for electronic applications without the need for the above described procedures to isolate the silver nanoparticles from the reaction mixture. In such embodiments, the reaction mixture (optionally augmented with another liquid which may be the same or different from the solvent used in the reaction mixture) may be used as the base for the silver nanoparticle inks upon addition of a rheology modifier to adjust the viscosity.

In embodiments, the silver nanoparticles may be present in the inks in a range from about 20 to about 80 weight percent, or from about 20 to about 70 weight percent, or from about 40 to about 70 weight percent, including any ranges in between and fractions thereof.

In embodiments, the ink comprises an aminomethylsilane viscosifier, such as the aminomethylsilane viscosifier of Formula (I):

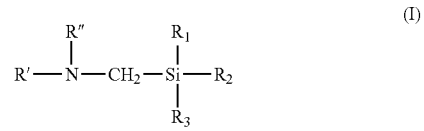

wherein each of $R_1$, $R_2$, and $R_3$ are independently selected from the group consisting of alkyl, alkoxy, halogen, and hydrogen, and wherein at least one of $R_1$, $R_2$, and $R_3$ is selected from the group consisting of methoxy, ethoxy, propoxy, butoxy, and chloro, and each of R' and R" are independently hydrogen or an aliphatic group optionally substituted with an amino group or an optionally substituted phenyl group. Exemplary compounds of formula (i) include, without limitation, N-(6-aminohexyl)aminomethyltrimethoxysilane, N-butyl-aza-2,2-dimethocysilacyclopentane, (cyclohexylaminomethyl)triethoxysilane, (cyclohexylaminomethyl)methyl diethoxysilane, (N-phenylaminomethyl)methyldimethoxysilane, (N-phenylaminomethyl)methyldiethoxysilane, (N-phenylaminomethyl)methyltriethoxysilane, dietthylaminomethylmethyldiethoxysilane, aminoethylaminomethyltriethoxysilane, aminoethylaminomethylmethyldiethyoxysilane, piperazinylmethylmethyldiethoxysilane, morpholinylmethyltriethoxysilane, morpholinylmethylmethyldiethoxysilane, and the like.

More specifically, the aminomethylsilane additive has a structure of Formula (II), wherein $R_1$, $R_2$, and $R_3$ are the same as discussed above; R' is an aliphatic group, especially amino group substituted aliphatic group, for example, aminopropyl, aminobutyl, aminopentyl, aminohexyl, aminoheptyl, and the like.

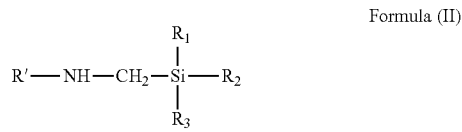

Formula (II)

In embodiments, R' is H and R" an aliphatic group optionally substituted with an amino group.

In embodiments, the aminomethylsilane is N-(6-aminohexyl)aminomethyltriethoxysilane or N-(6-aminohexyl)aminomethyltrimethoxysilane.

Any of the variable substituents in Formula (I) or Formula (II), may include substitution by any of the functionality defined herein below. Any definition may be used in combination with any other definition to describe a composite structural group. By convention, the trailing element of any such definition is that which attaches to the parent moiety. For example, the composite group alkylamido would represent an alkyl group attached to the parent molecule through an amido group, and the term alkoxyalkyl would represent an alkoxy group attached to the parent molecule through an alkyl group.

The term "optionally substituted" means the anteceding group may be substituted or unsubstituted. When substituted, the substituents of an "optionally substituted" group may include, without limitation, one or more substituents independently selected from the following groups or a particular designated set of groups, alone or in combination: lower alkyl, lower alkenyl, lower alkynyl, lower alkanoyl, lower heterocycloalkyl, lower heterocycloalkyl, lower haloalkyl, lower haloalkenyl, lower haloalkynyl, lower perhaloalkyl, lower perhaloalkoxy, lower cycloalkyl, phenyl, aryl, aryloxy, lower alkoxy, lower haloalkoxy, oxo, lower acyloxy, carbonyl, carboxyl, lower alkylcarbonyl, lower carboxyester, lower carboxamido, cyano, hydrogen, halogen, hydroxy, amino, lower alkylamino, arylamino, amido, nitro, thiol, lower alkylthio, lower haloalkylthio, lower perhaloalkylthio, arylthio, sulfonate, sulfonic acid, trisubstituted silyl, $N_3$, SH, $SCH_3$, $C(O)CH_3$, $CO_2CH_3$, $CO_2H$, pyridinyl, thiophene, furanyl, lower carbamate, and lower urea. Two substituents may be joined together to form a fused five-, six-, or seven-membered carbocyclic or heterocyclic ring consisting of zero to three heteroatoms, for example forming methylenedioxy or ethylenedioxy. An optionally substituted group may be unsubstituted (e.g., $—CH_2CH_3$), fully substituted (e.g., $—CF_2CF_3$), monosubstituted (e.g., $—CH_2CH_2F$) or substituted at a level anywhere in-between fully substituted and monosubstituted (e.g., $—CH_2CF_3$). Where substituents are recited without qualification as to substitution, both substituted and unsubstituted forms are encompassed. Where a substituent is qualified as "substituted," the substituted form is specifically intended. Additionally, different sets of optional substituents to a particular moiety may be defined as needed; in these cases, the optional substitution will be as defined, often immediately following the phrase, "optionally substituted with."

The term "acyl," as used herein, alone or in combination, refers to a carbonyl attached to an alkenyl, alkyl, aryl, cycloalkyl, heteroaryl, heterocycle, or any other moiety were the atom attached to the carbonyl is carbon. An "acetyl" group refers to a $—C(O)CH_3$ group. An "alkylcarbonyl" or "alkanoyl" group refers to an alkyl group attached to the parent molecular moiety through a carbonyl group. Examples of such groups include methylcarbonyl and ethylcarbonyl. Examples of acyl groups include formyl, alkanoyl and aroyl.

The term "alkenyl," as used herein, alone or in combination, refers to a straight-chain or branched-chain hydrocarbon radical having one or more double bonds and containing from 2 to 20 carbon atoms. In certain embodiments, the alkenyl will comprise from 2 to 6 carbon atoms. The term "alkenylene" refers to a carbon-carbon double bond system attached at two or more positions such as ethenylene [($—CH=CH—$), ($—C::C—$)]. Examples of suitable alkenyl radicals include ethenyl, propenyl, 2-methylpropenyl, 1,4-butadienyl and the like. Unless otherwise specified, the term "alkenyl" may include "alkenylene" groups.

The term "alkoxy," as used herein, alone or in combination, refers to an alkyl ether radical, wherein the term alkyl is as defined below. Examples of suitable alkyl ether radicals include methoxy, ethoxy, n-propoxy, isopropoxy, n-butoxy, iso-butoxy, sec-butoxy, tert-butoxy, and the like.

The term "alkyl," as used herein, alone or in combination, refers to a straight-chain or branched-chain alkyl radical containing from 1 to 20 carbon atoms. In certain embodiments, the alkyl will comprise from 1 to 10 carbon atoms. In further embodiments, the alkyl will comprise from 1 to 6 carbon atoms. Alkyl groups may be optionally substituted as defined herein. Examples of alkyl radicals include methyl, ethyl, n-propyl, isopropyl, n-butyl, isobutyl, sec-butyl, tert-butyl, pentyl, iso-amyl, hexyl, octyl, noyl and the like. The term "alkylene," as used herein, alone or in combination, refers to a saturated aliphatic group derived from a straight or branched chain saturated hydrocarbon attached at two or more positions, such as methylene ($—CH_2—$). Unless otherwise specified, the term "alkyl" may include "alkylene" groups.

The term "alkylamino," as used herein, alone or in combination, refers to an alkyl group attached to the parent molecular moiety through an amino group. Suitable alkylamino groups may be mono- or dialkylated, forming groups such as, for example, N-methylamino, N-ethylamino, N,N-dimethylamino, N,N-ethylmethylamino and the like.

The term "alkylidene," as used herein, alone or in combination, refers to an alkenyl group in which one carbon atom of the carbon-carbon double bond belongs to the moiety to which the alkenyl group is attached.

The term "alkylthio," as used herein, alone or in combination, refers to an alkyl thioether (R—S—) radical wherein the term alkyl is as defined above and wherein the sulfur may be singly or doubly oxidized. Examples of suitable alkyl thioether radicals include methylthio, ethylthio, n-propylthio, isopropylthio, n-butylthio, iso-butylthio, sec-butylthio, tert-butylthio, methanesulfonyl, ethanesulfinyl, and the like.

The term "alkynyl," as used herein, alone or in combination, refers to a straight-chain or branched chain hydrocarbon radical having one or more triple bonds and containing from 2 to 20 carbon atoms. In certain embodiments, the alkynyl comprises from 2 to 6 carbon atoms. In further embodiments, the alkynyl comprises from 2 to 4 carbon atoms. The term "alkynylene" refers to a carbon-carbon triple bond attached at two positions such as ethynylene (—C:::C—, —C.ident.C—). Examples of alkynyl radicals include ethynyl, propynyl, hydroxypropynyl, butyn-1-yl, butyn-2-yl, pentyn-1-yl, 3-methylbutyn-1-yl, hexyn-2-yl, and the like. Unless otherwise specified, the term "alkynyl" may include "alkynylene" groups.

The terms "amido" and "carbamoyl," as used herein, alone or in combination, refer to an amino group as described below attached to the parent molecular moiety through a carbonyl group, or vice versa. The term "C-amido" as used herein, alone or in combination, refers to a —C(=O)—NR$_2$ group with R as defined herein. The term "N-amido" as used herein, alone or in combination, refers to a RC(=O)NH— group, with R as defined herein. The term "acylamino" as used herein, alone or in combination, embraces an acyl group attached to the parent moiety through an amino group. An example of an "acylamino" group is acetylamino (CH3C(O)NH—).

The term "amino," as used herein, alone or in combination, refers to —NRR, wherein R and R' are independently selected from the group consisting of hydrogen, alkyl, acyl, heteroalkyl, aryl, cycloalkyl, heteroaryl, and heterocycloalkyl, any of which may themselves be optionally substituted. Additionally, R and R' may combine to form heterocycloalkyl, either of which may be optionally substituted.

The term "aryl," as used herein, alone or in combination, means a carbocyclic aromatic system containing one, two or three rings wherein such polycyclic ring systems are fused together. The term "aryl" embraces aromatic groups such as phenyl, naphthyl, anthracenyl, and phenanthryl.

The term "arylalkenyl" or "aralkenyl," as used herein, alone or in combination, refers to an aryl group attached to the parent molecular moiety through an alkenyl group.

The term "arylalkoxy" or "aralkoxy," as used herein, alone or in combination, refers to an aryl group attached to the parent molecular moiety through an alkoxy group.

The term "arylalkyl" or "aralkyl," as used herein, alone or in combination, refers to an aryl group attached to the parent molecular moiety through an alkyl group.

The term "arylalkynyl" or "aralkynyl," as used herein, alone or in combination, refers to an aryl group attached to the parent molecular moiety through an alkynyl group.

The term "arylalkanoyl" or "aralkanoyl" or "aroyl," as used herein, alone or in combination, refers to an acyl radical derived from an aryl-substituted alkanecarboxylic acid such as benzoyl, naphthoyl, phenylacetyl, 3-phenylpropionyl(hydrocinnamoyl), 4-phenylbutyryl, (2-naphthyl)acetyl, 4-chlorohydrocinnamoyl, and the like.

The term aryloxy as used herein, alone or in combination, refers to an aryl group attached to the parent molecular moiety through an oxy.

The terms "benzo" and "benz," as used herein, alone or in combination, refer to the divalent radical C$_6$H$_4$-derived from benzene. Examples include benzothiophene and benzimidazole.

The term "carbamate," as used herein, alone or in combination, refers to an ester of carbamic acid (—NHCOO—) which may be attached to the parent molecular moiety from either the nitrogen or acid end, and which may be optionally substituted as defined herein.

The term "O-carbamyl" as used herein, alone or in combination, refers to a —OC(O)NRR', group with R and R' as defined herein.

The term "N-carbamyl" as used herein, alone or in combination, refers to a ROC(O)NR'— group, with R and R' as defined herein.

The term "carbonyl," as used herein, when alone includes formyl [—C(O)H] and in combination is a —C(O)— group.

The term "carboxyl" or "carboxy," as used herein, refers to —C(O)OH or the corresponding "carboxylate" anion, such as is in a carboxylic acid salt. An "O-carboxy" group refers to a RC(O)O— group, where R is as defined herein. A "C-carboxy" group refers to a —C(O)OR groups where R is as defined herein.

The term "cyano," as used herein, alone or in combination, refers to —CN.

The term "cycloalkyl," or, alternatively, "carbocycle," as used herein, alone or in combination, refers to a saturated or partially saturated monocyclic, bicyclic or tricyclic alkyl group wherein each cyclic moiety contains from 3 to 12 carbon atom ring members and which may optionally be a benzo fused ring system which is optionally substituted as defined herein. In certain embodiments, the cycloalkyl will comprise from 5 to 7 carbon atoms. Examples of such cycloalkyl groups include cyclopropyl, cyclobutyl, cyclopentyl, cyclohexyl, cycloheptyl, tetrahydronaphthyl, indanyl, octahydronaphthyl, 2,3-dihydro-1H-indenyl, adamantyl and the like. "Bicyclic" and "tricyclic" as used herein are intended to include both fused ring systems, such as decahydronaphthalene, octahydronaphthalene as well as the multicyclic (multicentered) saturated or partially unsaturated type. The latter type of isomer is exemplified in general by, bicyclo[1,1,1]pentane, camphor, adamantane, and bicyclo[3,2,1]octane.

The term "ester," as used herein, alone or in combination, refers to a carboxy group bridging two moieties linked at carbon atoms.

The term "ether," as used herein, alone or in combination, refers to an oxy group bridging two moieties linked at carbon atoms.

The term "halo," or "halogen," as used herein, alone or in combination, refers to fluorine, chlorine, bromine, or iodine.

The term "haloalkoxy," as used herein, alone or in combination, refers to a haloalkyl group attached to the parent molecular moiety through an oxygen atom.

The term "haloalkyl," as used herein, alone or in combination, refers to an alkyl radical having the meaning as defined above wherein one or more hydrogens are replaced with a halogen. Specifically embraced are monohaloalkyl, dihaloalkyl and polyhaloalkyl radicals. A monohaloalkyl radical, for one example, may have an iodo, bromo, chloro or fluoro atom within the radical. Dihalo and polyhaloalkyl radicals may have two or more of the same halo atoms or a combination of different halo radicals. Examples of haloalkyl radicals include fluoromethyl, difluoromethyl, trifluoromethyl, chloromethyl, dichloromethyl, trichloromethyl, pentafluoroethyl, heptafluoropropyl, difluorochloromethyl, dichlorofluoromethyl, difluoroethyl, difluoropropyl, dichloroethyl and dichloropropyl. "Haloalkylene" refers to a haloalkyl group attached at two or more positions. Examples include fluoromethylene (—CFH—), difluoromethylene (—CF$_2$—), chloromethylene (—CHCl—) and the like.

The term "heteroalkyl," as used herein, alone or in combination, refers to a stable straight or branched chain, or cyclic hydrocarbon radical, or combinations thereof, fully saturated or containing from 1 to 3 degrees of unsaturation, consisting of the stated number of carbon atoms and from one to three heteroatoms selected from the group consisting of O, N, and S, and wherein the nitrogen and sulfur atoms may optionally be oxidized and the nitrogen heteroatom may optionally be quaternized. The heteroatom(s) O, N and S may be placed at any interior position of the heteroalkyl group. Up to two heteroatoms may be consecutive, such as, for example, —CH$_2$—NH—OCH$_3$.

The term "heteroaryl," as used herein, alone or in combination, refers to a 3 to 7 membered unsaturated heteromonocyclic ring, or a fused monocyclic, bicyclic, or tricyclic ring system in which at least one of the fused rings is aromatic, which contains at least one atom selected from the group consisting of O, S, and N. In certain embodiments, the heteroaryl will comprise from 5 to 7 carbon atoms. The term also embraces fused polycyclic groups wherein heterocyclic rings are fused with aryl rings, wherein heteroaryl rings are fused with other heteroaryl rings, wherein heteroaryl rings are fused with heterocycloalkyl rings, or wherein heteroaryl rings are fused with cycloalkyl rings. Examples of heteroaryl groups include pyrrolyl, pyrrolinyl, imidazolyl, pyrazolyl, pyridyl, pyrimidinyl, pyrazinyl, pyridazinyl, triazolyl, pyranyl, furyl, thienyl, oxazolyl, isoxazolyl, oxadiazolyl, thiazolyl, thiadiazolyl, isothiazolyl, indolyl, isoindolyl, indolizinyl, benzimidazolyl, quinolyl, isoquinolyl, quinoxalinyl, quinazolinyl, indazolyl, benzotriazolyl, benzodioxolyl, benzopyranyl, benzoxazolyl, benzoxadiazolyl, benzothiazolyl, benzothiadiazolyl, benzofuryl, benzothienyl, chromonyl, coumarinyl, benzopyranyl, tetrahydroquinolinyl, tetrazolopyridazinyl, tetrahydroisoquinolinyl, thienopyridinyl, furopyridinyl, pyrrolopyridinyl and the like. Exemplary tricyclic heterocyclic groups include carbazolyl, benzidolyl, phenanthrolinyl, dibenzofuranyl, acridinyl, phenanthridinyl, xanthenyl and the like.

The terms "heterocycloalkyl" and, interchangeably, "heterocycle," as used herein, alone or in combination, each refer to a saturated, partially unsaturated, or fully unsaturated monocyclic, bicyclic, or tricyclic heterocyclic group containing at least one heteroatom as a ring member, wherein each the heteroatom may be independently selected from the group consisting of nitrogen, oxygen, and sulfur In certain embodiments, the heterocycloalkyl will comprise from 1 to 4 heteroatoms as ring members. In further embodiments, the heterocycloalkyl will comprise from 1 to 2 heteroatoms as ring members. In certain embodiments, the heterocycloalkyl will comprise from 3 to 8 ring members in each ring. In further embodiments, the heterocycloalkyl will comprise from 3 to 7 ring members in each ring. In yet further embodiments, the heterocycloalkyl will comprise from 5 to 6 ring members in each ring. "Heterocycloalkyl" and "heterocycle" are intended to include sulfones, sulfoxides, N-oxides of tertiary nitrogen ring members, and carbocyclic fused and benzo fused ring systems; additionally, both terms also include systems where a heterocycle ring is fused to an aryl group, as defined herein, or an additional heterocycle group. Examples of heterocycle groups include aziridinyl, azetidinyl, 1,3-benzodioxolyl, dihydroisoindolyl, dihydroisoquinolinyl, dihydrocinnolinyl, dihydrobenzodioxinyl, dihydro[1,3]oxazolo[4,5-b]pyridinyl, benzothiazolyl, dihydroindolyl, dihy-dropyridinyl, 1,3-dioxanyl, 1,4-dioxanyl, 1,3-dioxolanyl, isoindolinyl, morpholinyl, piperazinyl, pyrrolidinyl, tetrahydropyridinyl, piperidinyl, thiomorpholinyl, and the like. The heterocycle groups may be optionally substituted unless specifically prohibited.

The term "hydrazinyl" as used herein, alone or in combination, refers to two amino groups joined by a single bond, i.e., —N—N—.

The term "hydroxy," as used herein, alone or in combination, refers to —OH.

The term "hydroxyalkyl," as used herein, alone or in combination, refers to a hydroxy group attached to the parent molecular moiety through an alkyl group.

The term "imino," as used herein, alone or in combination, refers to =N—.

The term "iminohydroxy," as used herein, alone or in combination, refers to =N(OH) and =N—O—.

The phrase "in the main chain" refers to the longest contiguous or adjacent chain of carbon atoms starting at the point of attachment of a group to the compounds of any one of the formulas disclosed herein.

The term "isocyanato" refers to a —NCO group.

The term "isothiocyanato" refers to a —NCS group.

The phrase "linear chain of atoms" refers to the longest straight chain of atoms independently selected from carbon, nitrogen, oxygen and sulfur.

The term "lower," as used herein, alone or in a combination, where not otherwise specifically defined, means containing from 1 to and including 6 carbon atoms.

The term "lower aryl," as used herein, alone or in combination, means phenyl or naphthyl, which may be optionally substituted as provided.

The term "lower heteroaryl," as used herein, alone or in combination, means either 1) monocyclic heteroaryl comprising five or six ring members, of which from one to four members may be heteroatoms selected from the group consisting of O, S, and N, or 2) bicyclic heteroaryl, wherein each of the fused rings comprises five or six ring members, comprising between them one to four heteroatoms selected from the group consisting of O, S, and N.

The term "lower cycloalkyl," as used herein, alone or in combination, means a monocyclic cycloalkyl having between three and six ring members. Lower cycloalkyls may be unsaturated. Examples of lower cycloalkyl include cyclopropyl, cyclobutyl, cyclopentyl, and cyclohexyl.

The term "lower heterocycloalkyl," as used herein, alone or in combination, means a monocyclic heterocycloalkyl having between three and six ring members, of which between one and four may be heteroatoms selected from the group consisting of O, S, and N. Examples of lower heterocycloalkyls include pyrrolidinyl, imidazolidinyl, pyrazolidinyl, piperidinyl, piperazinyl, and morpholinyl. Lower heterocycloalkyls may be unsaturated.

The term "lower amino," as used herein, alone or in combination, refers to —NRR', wherein R and R' are independently selected from the group consisting of hydrogen, lower alkyl, and lower heteroalkyl, any of which may be optionally substituted. Additionally, the R and R' of a lower amino group may combine to form a five- or six-membered heterocycloalkyl, either of which may be optionally substituted.

The term "mercaptyl" as used herein, alone or in combination, refers to an RS— group, where R is as defined herein.

The term "nitro," as used herein, alone or in combination, refers to —NO$_2$.

The terms "oxy" or "oxa," as used herein, alone or in combination, refer to —O—.

The term "oxo," as used herein, alone or in combination, refers to =O.

The term "perhaloalkoxy" refers to an alkoxy group where all of the hydrogen atoms are replaced by halogen atoms.

The term "perhaloalkyl" as used herein, alone or in combination, refers to an alkyl group where all of the hydrogen atoms are replaced by halogen atoms.

The terms "sulfonate," "sulfonic acid," and "sulfonic," as used herein, alone or in combination, refers to the —SO$_3$H group and its anion as the sulfonic acid is used in salt formation.

The term "sulfanyl," as used herein, alone or in combination, refers to —S—.

The term "sulfinyl," as used herein, alone or in combination, refers to —S(O)—.

The term "sulfonyl," as used herein, alone or in combination, refers to —S(O)$_2$—.

The term "N-sulfonamido" refers to a RS(=O)$_2$NR— group with R and R' as defined herein.

The term "S-sulfonamido" refers to a —S(=O)$_2$NRR', group, with R and R' as defined herein.

The terms "thia" and "thio," as used herein, alone or in combination, refer to a —S— group or an ether wherein the oxygen is replaced with sulfur. The oxidized derivatives of the thio group, namely sulfinyl and sulfonyl, are included in the definition of thia and thio.

The term "thiol," as used herein, alone or in combination, refers to an —SH group.

The term "thiocarbonyl," as used herein, when alone includes thioformyl —C(S)H and in combination is a —C(S)— group.

The term "N-thiocarbamyl" refers to an ROC(S)NR'— group, with R and R' as defined herein.

The term "O-thiocarbamyl" refers to a —OC(S)NRR', group with R and R' as defined herein.

The term "thiocyanato" refers to a —CNS group.

The term "trihalomethanesulfonamido" refers to a X$_3$CS(O)$_2$NR— group with X is a halogen and R as defined herein.

The term "trihalomethanesulfonyl" refers to a X$_3$CS(O)$_2$— group where X is a halogen.

The term "trihalomethoxy" refers to a X$_3$CO— group where X is a halogen.

The term "trisubstituted silyl," as used herein, alone or in combination, refers to a silicone group substituted at its three free valences with groups as listed herein under the definition of substituted amino. Examples include trimethysilyl, tert-butyldimethylsilyl, triphenylsilyl and the like.

In general, the ink comprises silver nanoparticles, hydrocarbon solvents such as decalin, bicyclohexyl, tetrahydronaphthalene, toluene, trimethylbenzene, butylbenzene, pentylbenzene, and the like, and a very small amount of the aminosilane additive for example from about 0.01 to about 3.0 weight percent, including from about 0.01 to about 1.5 weight percent, or from about 0.05 to about 1.0 weight percent, or from about 0.1 to about 1.0 weight percent based on the total weight of the silver in the ink. This aminosilane is so effective to adjust viscosity that very small amounts are required to have a large impact on viscosity. This comports well with the typical use of such inks in downstream printed conductive features, because large amounts of viscosifier can adversely affect the conductivity of the final annealed silver nanoparticle conductive feature. Finally, it should be noted that the aminomethylsilane viscosifier disclosed herein can be used to adjust viscosity for other metal nanoparticle inks or silver inks containing silver nanoparticles have stabilizers other than organoamine.

In embodiments, the aminomethylsilane viscosifier is present in an amount from about 0.01 weight percent to about 1.5 weight percent of the plurality of silver nanoparticles. In embodiments, a viscosity in a range from about 5 cps to about 5,000 cps, depending on the downstream printing application. Typically, ink viscosity may be in a range from about 5 to about 20 cps for inkjet printing, or from about 20 to about 500 cps for flexographic printing, or about 30 to about 1,200 cps for gravure printing, and sometimes greater than about 3,000 cps, or greater than about 10,000 cps for screen printing. In embodiments, the ink viscosity is adjusted to provide an inkjet ink, an aerosol jet ink, a fleoxographic ink, a gravure ink, or a screen ink.

In embodiments, when the ink is annealed in a film, the film has a conductivity in a range from about $1.0 \times 10^4$ S/cm to about $1.6 \times 10^5$ S/cm, including, from about $5.0 \times 10^4$ S/cm to about $1.6 \times 10^5$ S/cm, or about $1.0 \times 10^5$ S/cm to about $1.6 \times 10^5$ S/cm.

In embodiments, there are provided methods comprising providing an ink comprising a plurality of silver nanoparticles, an aminomethylsilane viscosifier, and a hydrocarbon solvent, printing an image on a substrate with the ink; and annealing the image on the substrate. In embodiments, the printing step may be accomplished by inkjet, flexographic, or gravure printing. In embodiments, the annealing may be conducted at an elevated temperature, such as between about 80° C. to about 200° C., including from about 80° C. to about 160° C., or from about 100° C. to about 140° C.

In embodiments, the image is a printed circuit, and or a conductive trace. Exemplary circuit or conductive trace may be electrodes for transistors, diodes, and capacitors; interconnects for transistors, resistors, diodes, and capacitors; conductive traces for antennas, and the like. The thickness of the conductive trace may depend on the type of printing methods.

In embodiments, the aminomethylsilane viscosifier disclosed herein is present in an amount from about 0.01 weight percent to about 1.5 weight percent of the plurality of silver nanoparticles. When printing, the ink has a viscosity from about 5 cps to about 1000 cps.

In some embodiments, there are provided inks comprising organoamine-stabilized silver nanoparticles, N-(6-aminohexyl)aminomethyltriethoxysilane as a viscosifier, and a hydrocarbon solvent. In some such embodiments, the ink has a viscosity for inkjet printing, flexographic printing, or gravure printing and the N-(6-aminohexyl)aminomethyltriethoxysilane is present in an amount from about 0.01 weight percent to about 1.5 weight percent of the plurality of silver nanoparticles.

The inks exemplified herein employing aminomethylsilane viscosifier is so effective in adjusting the ink viscosity that the inks could be made for inkjet, flexographic, and gravure printing. Moreover, due to the small amounts employed, the viscosifier did not affect the conductivity of the final annealed silver film.

It should be noted that the aminomethylsilane viscosifier can be used together with other viscosity and/or surface tension modifiers, adhesion promoters, and the like. For example, polymeric additives can be used together with the aminomethylsilane viscosifier to further increase the viscosity, or to tune the shear thinning index. Ink compositions may further comprise an additive of one or more selected from a leveling agent, a wetting agent, a surfactant, a dispersion stabilizer, an anti-settling agent, a pH control agent, a thickener, a slip, a foam, a glue, an adhesive, a thixotropic agent, an antioxidant, a crosslinking agent, an anti-skinning agent, an anti-cratering agent, a plasticizer, a drying agent, a flame retardant, a blocking preventer, a corrosion inhibitor, a coupling agent, a floating agent, and a dye. Leveling agents may include siloxane-based leveling agents including polydimethylsiloxane, polyether-modified polydimethylsiloxane, polyether-modified siloxane, and the like.

The following Examples are being submitted to illustrate embodiments of the present disclosure. These Examples are intended to be illustrative only and are not intended to limit the scope of the present disclosure. Also, parts and percentages are by weight unless otherwise indicated. As used herein, "room temperature" refers to a temperature of from about 20° C. to about 25° C.

EXAMPLES

Example 1

This example describes the preparation of exemplary silver nanoparticle inks with N-(6-aminohexyl)aminomethyltriethyoxysilane.

Silver nanoparticles described in U.S. Pat. Nos. 7,270,694 and 8,765,025, and pending U.S. application Ser. No. 13/866,704 were used to generate exemplary inks, which preparations include about 71 weight percent dodecylamine stabilized silver nanoparticles dispersed in a solvent mixture of 6:1 decalin to bicyclohexyl. The final ink had a silver content about 65 weight percent. Based on the weight of silver in the ink, N-(6-aminohexyl)aminomethyltriethyoxysilane was added as the viscosity modifier at 0.1 to 0.5 wt %. FIG. 1 shows the viscosities of the inks with different amount of the aminomethylsilane additive. One can see that this aminomethylsilane is an effective viscosity modifier, which can adjust the ink viscosity from a few centipoises to over 1000 cps upon a very small amount usage. The ink showed Newtonian behavior when a small amount (0.1-0.3 wt %) additive was used, and the viscosity remained low (8-22 cps). These inks are good candidates for inkjet printing. Adjustable viscosity could make the inkjettable ink for different print heads. When the aminomethylsilane viscosifier was at 0.4 to 0.5 wt %, the inks become non-Newtonian fluid with low shear rate viscosity of 229 and 1086, and high shear rate viscosity of 71 and 167 cps, respectively. The viscosity range and the shear thin feature indicated that the inks are good candidates for flexographic and gravure printing technologies.

The above inks were deposited into thin films to check if the additive has any adverse effect on conductivity. For the samples having the similar thickness, when annealed at the same temperature (120° C.) for 20 min, the samples with the aminomethylsilane additives exhibited the same conductivity as the control sample (without the viscosifier), showing a high conductivity of $1.0$-$1.6 \times 10^5$ S/cm.

Control Example 1: Ink formulations were made in the similar manner as in Example 1. In this Control Example, gamma-aminopropylsilanes were used to replace the aminomethylsilane in Example 1. Specifically, N-(beta-aminoethyl)gamma-aminopropyltrimethoxysilane, or N(beta-aminoethyl)gamma-aminopropyl methyldimethoxysilane was added at 0.5 wt %. However, no or little viscosity change was observed for the inks, indicating that gama-aminopropylsilanes are not an effective viscosity modifiers for the silver nanoparticle inks.

What is claimed is:

1. An ink comprising:
a plurality of silver nanoparticles;
an aminomethylsilane viscosifier;
wherein the aminomethylsilane is selected from the group consisting of N-butyl-aza-2,2-dimethocysilacyclopentane, (cyclohexylaminomethyl)triethoxysilane, (cyclohexylaminomethyl)methyl diethoxysilane, (N-phenylaminomethyl)methyldimethoxysilane, (N-phenylaminomethyl)methyldiethoxysilane, (N-phenylaminomethyl)methyltriethoxysilane, diethylaminomethylmethyldiethoxysilane, N-(6-aminohexyl) aminomethyltriethoxysilane, aminoethylaminomethyltriethoxysilane, aminoethylaminomethylmethyldiethyoxysilane, piperazinylmethylmethyldiethoxysilane, morpholinylmethyltriethoxysilane, and morpholinylmethylmethyldiethoxysilane; and
a hydrocarbon solvent.

2. The ink of claim 1, wherein the silver nanoparticles are stabilized.

3. The ink of claim 2, wherein the stabilized silver nanoparticles comprise an organoamine.

4. The ink of claim 1, wherein the silver nanoparticles are present from about 20 to about 80 weight percent.

5. The ink of claim 1, wherein the aminomethylsilane viscosifier is present in an amount from about 0.01 weight percent to about 3.0 weight percent of the plurality of silver nanoparticles.

6. The ink of claim 1, wherein the aminomethylsilane is N-(6-aminohexyl) aminomethyltriethoxysilane.

7. The ink of claim 1, wherein the ink is an inkjet ink, a fleoxographic ink, a gravure ink, or a screen ink.

8. The ink of claim 1, wherein when the ink is annealed in a film, the film has a conductivity in a range from about $1.0 \times 10^5$ S/cm to about $5.0 \times 10^5$ S/cm.

9. The ink of claim 1, having a viscosity in a range from about 5 cps to about 5,000 cps.

10. A method comprising:
providing an ink comprising:
a plurality of silver nanoparticles;
an aminomethylsilane viscosifier;
wherein the aminomethylsilane is selected from the group consisting of N-butyl-aza-2,2-dimethocysilacyclopentane, (cyclohexylaminomethyl)triethoxysilane, (cyclohexylaminomethyl)methyl diethoxysilane, (N-phenylaminomethyl)methyldimethoxysilane, (N-phenylaminomethyl)methyldiethoxysilane, (N-phenylaminomethyl)methyltriethoxysilane, diethylaminomethylmethyldiethoxysilane, N-(6-aminohexyl) aminomethyltriethoxysilane, aminoethylaminomethyltriethoxysilane, aminoethylaminomethylmethyldiethyoxysilane, piperazinylmethylmethyldiethoxysilane, morpholinylmethyltriethoxysilane, and morpholinylmethylmethyldiethoxysilane; and
a hydrocarbon solvent;
printing an image on a substrate with the ink; and
annealing the image on the substrate.

11. The method of claim 10, wherein the image is a printed circuit.

12. The method of claim 10, wherein the silver nanoparticles are stabilized by an organoamine.

13. The method of claim 10, wherein the aminomethylsilane viscosifier is N-(6-aminohexyl) aminomethyltriethoxysilane.

14. The method of claim 10, wherein the aminomethylsilane viscosifier is present in an amount from about 0.01 weight percent to about 1.5 weight percent of the plurality of silver nanoparticles.

15. The method of claim 10, wherein the ink has a viscosity from about 5 cps to about 5,000 cps.

16. An ink comprising:
organoamine-stabilized silver nanoparticles;
a viscosifier comprising N-(6-aminohexyl) aminomethyltriethoxysilane; and
a hydrocarbon solvent.

17. The ink of claim 16, wherein the ink has a viscosity for inkjet printing, flexographic printing, gravure printing, or screen printing.

18. The ink of claim 16, wherein N-(6-aminohexyl) aminomethyltriethoxysilane is present in an amount from about 0.01 weight percent to about 1.5 weight percent of the plurality of silver nanoparticles.

* * * * *